US008558556B2

(12) United States Patent
Lexa et al.

(10) Patent No.: US 8,558,556 B2
(45) Date of Patent: Oct. 15, 2013

(54) PLANAR-AXIAL THERMISTOR FOR BOLOMETRY

(75) Inventors: Jefferson D. Lexa, Chesterland, OH (US); Andrew S. Brush, Chardon, OH (US); John D. Swank, Hudson, OH (US)

(73) Assignee: Tegam, Inc., Geneva, OH (US)

( * ) Notice: Subject to any disclaimer, the term of this patent is extended or adjusted under 35 U.S.C. 154(b) by 387 days.

(21) Appl. No.: 12/983,640

(22) Filed: Jan. 3, 2011

(65) Prior Publication Data

US 2011/0169592 A1 Jul. 14, 2011

Related U.S. Application Data

(60) Provisional application No. 61/294,505, filed on Jan. 13, 2010.

(51) Int. Cl.
*G01R 27/06* (2006.01)

(52) U.S. Cl.
USPC ............................ 324/645; 324/637; 333/248

(58) Field of Classification Search
USPC ......................... 324/670, 685, 721; 338/22 R
See application file for complete search history.

(56) References Cited

U.S. PATENT DOCUMENTS

| | | | | |
|---|---|---|---|---|
| 2,414,792 | A * | 1/1947 | Becker | 338/18 |
| 4,160,227 | A * | 7/1979 | Ikegami et al. | 338/22 R |
| 5,508,630 | A | 4/1996 | Klemer et al. | |
| 5,546,810 | A | 8/1996 | Arikawa et al. | |
| 6,522,237 | B1 | 2/2003 | Ito et al. | |
| 7,723,684 | B1 | 5/2010 | Haddon et al. | |
| 2008/0114555 | A1 | 5/2008 | Scott | |

FOREIGN PATENT DOCUMENTS

JP 2008130939 A * 6/2008

OTHER PUBLICATIONS

PCT International Preliminary Report on Patentability issued Jul. 10, 2013.

* cited by examiner

*Primary Examiner* — Vincent Q Nguyen
(74) *Attorney, Agent, or Firm* — Buckingham, Doolittle & Burroughs, LLP

(57) ABSTRACT

A co-axial microwave bolometer architecture is disclosed that uses thick-film processes to construct very small thermistors on a substrate that is selected for low heat transfer. Thermal isolation is further enhanced by making the planar electrodes from a metal with lower heat transfer than typical electrical metals. Furthermore, a resistor with very strong temperature coefficient (thermistor), is arranged such that connecting metal paths are arranged axially, and as generally flat, thin, planar conductors. Additionally, the substrate of the thermistor is selected to have very low conductivity of heat, so the thermistor element itself is well isolated thermally from its surroundings.

17 Claims, 4 Drawing Sheets

PLANAR-AXIAL THERMISTOR FOR BOLOMETRY

CROSS-REFERENCE

This application claims priority from Provisional Patent Application Ser. No. 61/294,505 filed Jan. 13, 2010.

BACKGROUND

Conventional technology thermistors are constructed by either: placing a bolus of a prepared paste of thermistor material (commercially available) between two wires, then firing the bolus at high temperature to result in an irregular "ball" of thermistor material with wires extending outward for electrical connection. This arrangement, if very fine wires are used, can isolate the thermistor element from surrounding heat sinks by virtue of the relatively small metal area involved in the wires. Or, thick-film printing of thermistor paste onto a substrate, wherein electrical connections are made by preparing the substrate with two or more metallic traces before deposition, or by metalizing the substrate prior to deposition of the thermistor, then metalizing the upper surface of the thermistor in a second step.

In either case extant thermistor production uses common electronic substrates such as Alumina. These substrates have high conduction of heat, rendering the resulting thermistors unsuitable for low-power bolometry. Further, such thermistors are made as larger sheets and sawed, resulting in thermistors that are too large to use for bolometry.

Accordingly, there is a long felt need in the art for a thick-film process that constructs very small thermistors on a substrate selected for low heat transfer. Further, thermal isolation needs to be enhanced by making the planar electrodes from a metal with lower heat transfer than typical electrical metals.

SUMMARY

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

A co-axial microwave bolometer architecture is disclosed that uses thick-film processes to construct very small thermistors on a substrate that is selected for low heat transfer. Thermal isolation is further enhanced by making the planar electrodes from a metal with lower heat transfer than typical electrical metals.

Furthermore, a resistor with very strong temperature coefficient (thermistor), is arranged such that connecting metal paths are arranged axially, and as flat, thin, planar conductors. Further, the substrate of the thermistor is selected to have very low conductivity of heat, so the thermistor element itself is well isolated thermally from its surroundings.

Additionally, the co-axial microwave bolometer can use a dual coplanar waveguide, and can be used in any other application of bolometry, including waveguide power sensors for microwave power, but also possibly spectrometry, air flow sensors, or other applications in which bead-on-wire thermistor sensors are used.

To the accomplishment of the foregoing and related ends, certain illustrative aspects are described herein in connection with the following description and the annexed drawings. These aspects are indicative of the various ways in which the principles disclosed herein can be practiced and all aspects and equivalents thereof are intended to be within the scope of the claimed subject matter. Other advantages and novel features will become apparent from the following detailed description when considered in conjunction with the drawings.

DETAILED DESCRIPTION

Figure 1A:
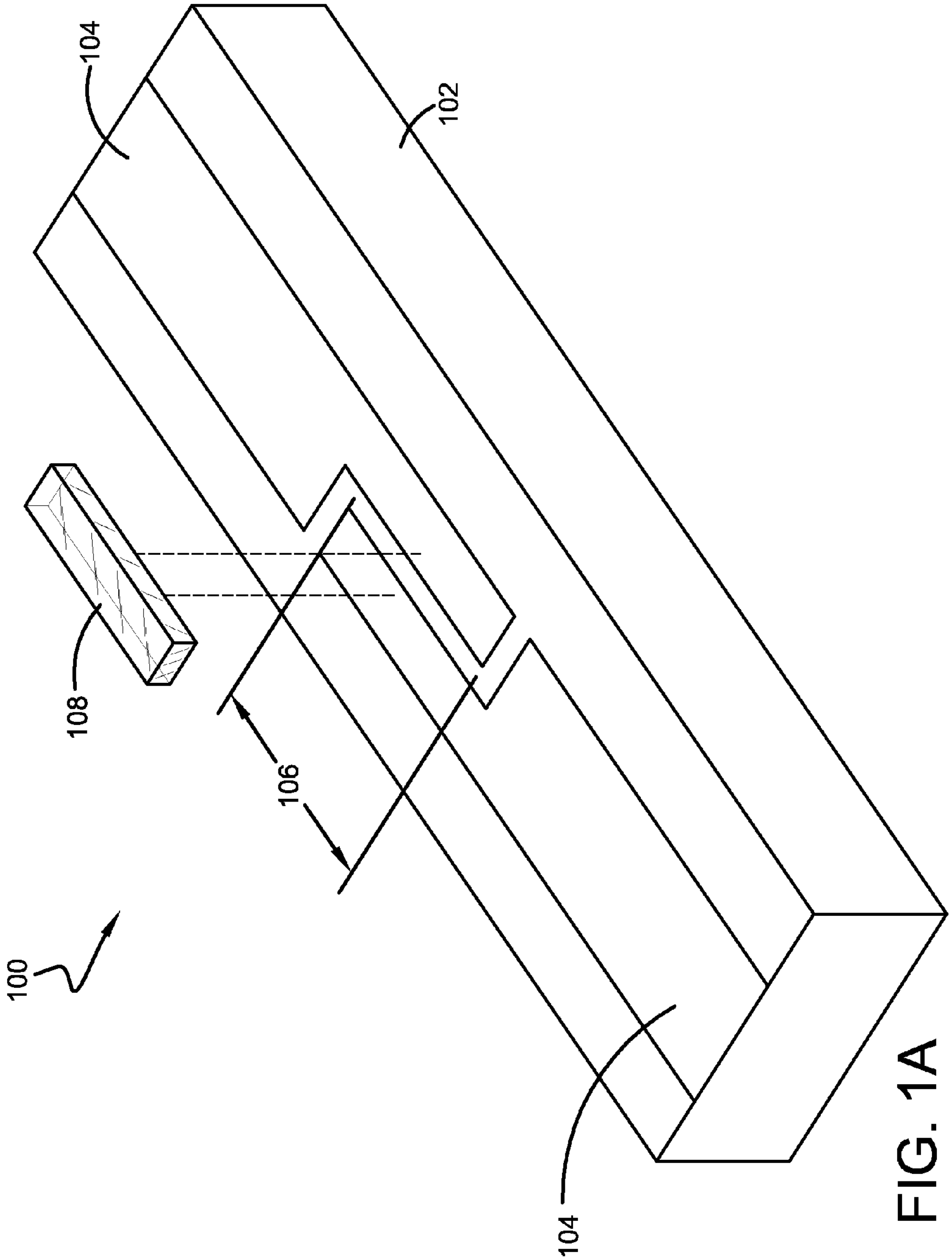
FIG. 1A illustrates a perspective view of a preferred embodiment of a thermistor in accordance with the disclosed architecture.

Conventional technology thermistors are typically constructed by either: (i) placing a bolus of a prepared paste of thermistor material between two wires, then firing the bolus at high temperature to result in an irregular "ball" of thermistor material with wires extending outward for electrical connection; or (ii) thick-film printing of thermistor paste onto a substrate, wherein electrical connections are made by preparing the substrate with two or more metallic traces before deposition, or by metalizing the substrate prior to deposition of the thermistor, then metalizing the upper surface of the thermistor in a second step.

In either case extant thermistor production uses common electronic substrates such as Alumina. These substrates have high conduction of heat, rendering the resulting thermistors unsuitable for low-power bolometry. Further, such thermistors are made as larger sheets and sawed, resulting in thermistors that are too large to use for bolometry.

Thus, use of commercial thick-film thermistors is impossible in a bolometer because they can not be adequately isolated from the environmental heat sinks. Use of commercial "bead-on-wire" thermistors results in an unsuitable inductive discontinuity when current concentrates from a wide waveguide into the very thin wire the bead hangs on. The currently claimed invention solves both problems because it is planar, and constructed on a substrate that does not conduct heat well. Specifically, a resistor with very strong temperature coefficient (thermistor), is arranged such that connecting metal paths are arranged axially, and as flat, thin, planar conductors. Further, the substrate of the thermistor is selected to have very low conductivity of heat, so the thermistor element itself is well isolated thermally from its surroundings.

The disclosed architecture uses thick-film processes to construct very small thermistors on a substrate that is selected for low heat transfer. Thermal isolation is further enhanced by making the planar electrodes from a metal with lower heat transfer than typical electrical metals. This embodiment used crystalline Quartz cleaved in the Z-axis for the substrate, and Palladium deposited only microns thick as the electrodes.

It is difficult to reach very low ohmic values of thermistor in thermistors that are suitable geometry for microwave bolometry in typical sensors. In the preferred embodiment, the electrodes are approximately 0.005" wide, and the room-temperature resistance is approximately 1,000 Ohms. However, the electrodes can be of any width practically manufacturable, which is determined for optimum matching with the associated waveguide, and of any room temperature resistance that results in a suitable RF termination when heated with a practical level of DC substitution power.

Furthermore, the co-axial microwave bolometer can use a dual coplanar waveguide, and can be used in any other application of bolometry, including waveguide power sensors for microwave power, but also possibly spectrometry, air flow sensors, or other applications in which bead-on-wire thermistor sensors are used today.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives falling within the spirit and scope of the claimed subject matter.

FIG. 1A illustrates a thermistor 100 in accordance with the disclosed architecture. The thermistor 100 is a resistor with a very strong temperature coefficient arranged such that connecting metal paths are arranged axially, and as flat, thin, planar conductors (not shown). FIG. 1A discloses a thermistor 100 created by applying thin, planar electrodes 104 to a substrate 102 using any appropriate metallization process, including but not limited to, thick film, thin film, vapor deposition, and possibly trimmed to dimension by chemical, vapor, plasma, or laser etching with or without masking, such that a gap 106 is created between the electrodes. Across the gap 106, resistive thermistor material 108 having a high temperature coefficient is attached using a thick film process which may be but is not limited to screen printing or stenciling using a mask. Furthermore, substrate 102 is selected to have a low dielectric constant and low heat transfer, unlike typical industrial thermistor substrates. Electrodes 104 are arranged to be much wider than they are thick, presenting a width and cross-section that can be tailored to match a surface waveguide such as a stripline or the center conductor of a coplanar waveguide. The electrodes 104 are made using conductive material which may be metal, and which has a relatively low heat conductivity while not introducing excessive resistance. By extending the length of the electrodes 104 a distance from the actual resistive thermistor material 108, the thin metal serves to further thermally isolate the thermistor from metal traces to which the thermistor 100 is attached. The thermistor 100 is typically attached by epoxy or solder between the distal ends of the electrodes 104 and the metal traces. All processing takes place on a single side of the substrate 102.

Furthermore, this embodiment used crystalline Quartz cleaved in the Z-axis for the substrate 102, and Palladium deposited only microns thick as the electrodes 104. Typically, the electrodes 104 are 0.005" wide and have a room temperature resistance of 1,000 Ohms. However, the electrodes 104 can be of any width practically manufacturable, which is determined for optimum matching with the associated waveguide, and of any room temperature resistance that results in a suitable RF termination when heated with a practical level of DC substitution power.

Figure 1B:
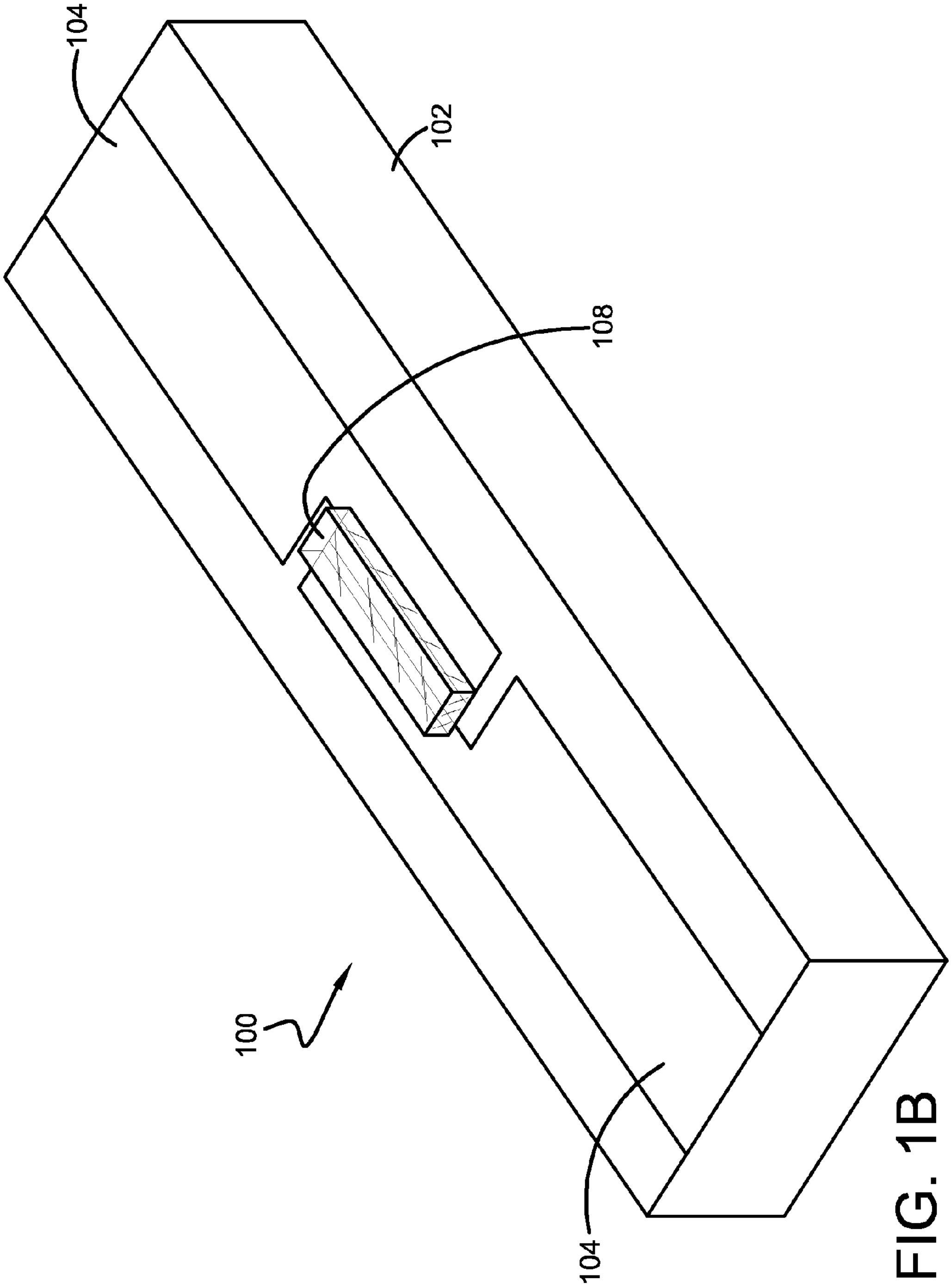
FIG. 1B illustrates a perspective view of a preferred embodiment of a thermistor wherein thermistor material covers the gap, in accordance with the disclosed architecture.

FIG. 1B illustrates a thermistor 100 in accordance with the disclosed architecture, wherein a thermistor material 108 bridges the gap created by the electrodes. Specifically, FIG. 1B discloses a thermistor 100 created by applying thin, planar electrodes 104 to a substrate 102 using any appropriate metallization process, such that a gap (not shown) is created between the electrodes 104. Across the gap, resistive thermistor material 108 having a high temperature coefficient is attached using a thick film process which may be but is not limited to screen printing or stenciling using a mask. Furthermore, substrate 102 is selected to have a low dielectric constant and low heat transfer, unlike typical industrial thermistor substrates. Electrodes 104 are arranged to be much wider than they are thick, presenting a width and cross-section that can be tailored to match a surface waveguide such as a stripline or the center conductor of a coplanar waveguide. By extending the length of the electrodes 104 a distance from the actual resistive thermistor material 108, the thin metal serves to further thermally isolate the thermistor from metal traces to which the thermistor 100 is attached.

Figure 2:
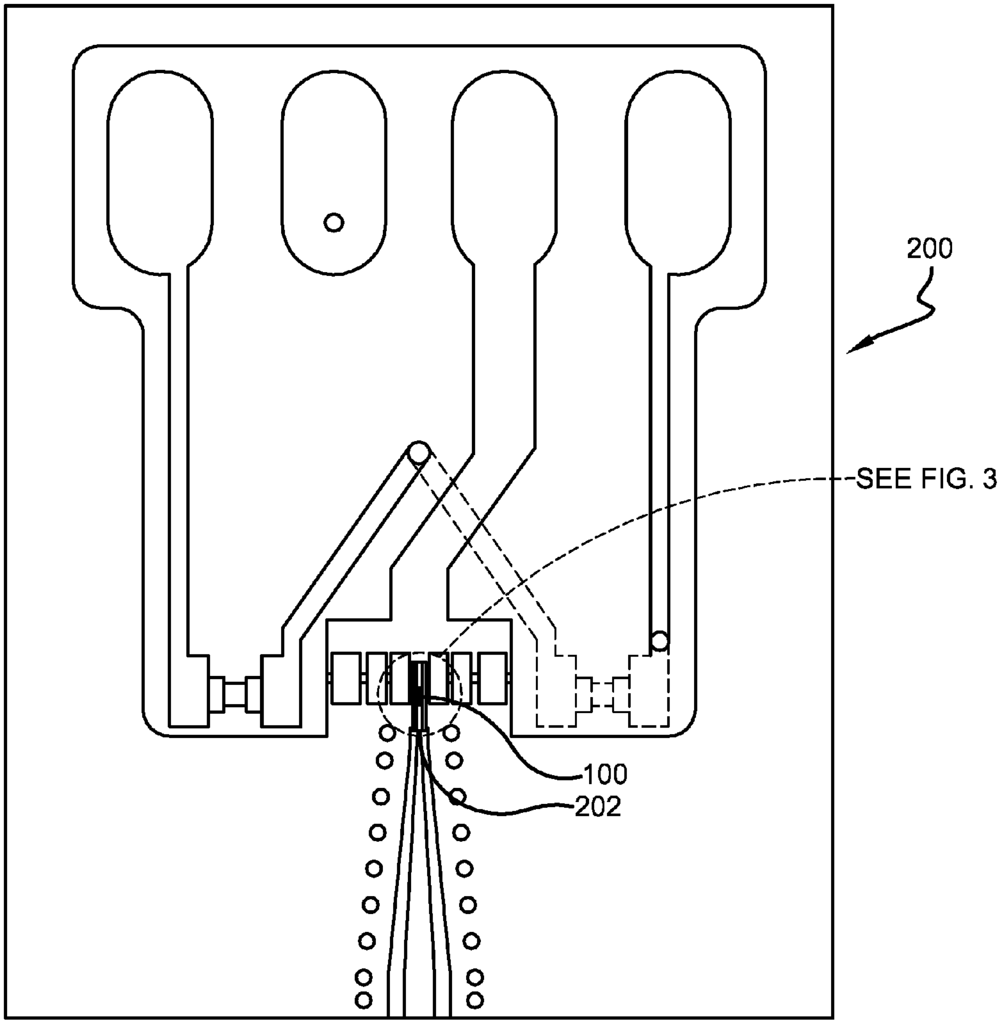
FIG. 2 illustrates a top view of a microwave termination in accordance with the disclosed architecture.

FIG. 2 illustrates an example microwave termination 200 in which the thermistor 100 is employed as the termination resistance to create a DC substitution power sensor. The exact details of the sensor are the subject of U.S. patent application Ser. No. 12/983,526, which is herein incorporated by reference. Specifically, FIG. 2 illustrates how the thermistor 100 can be matched to a microwave coplanar waveguide with center conductor 202 having the same width as the thermistor electrodes 104. Unlike some thermistors that require both attach and wire-bonding, the thermistor 100 is attached directly to circuit traces using solder or conductive epoxy in small patches at the outer ends of the electrodes (not shown).

Figure 3:
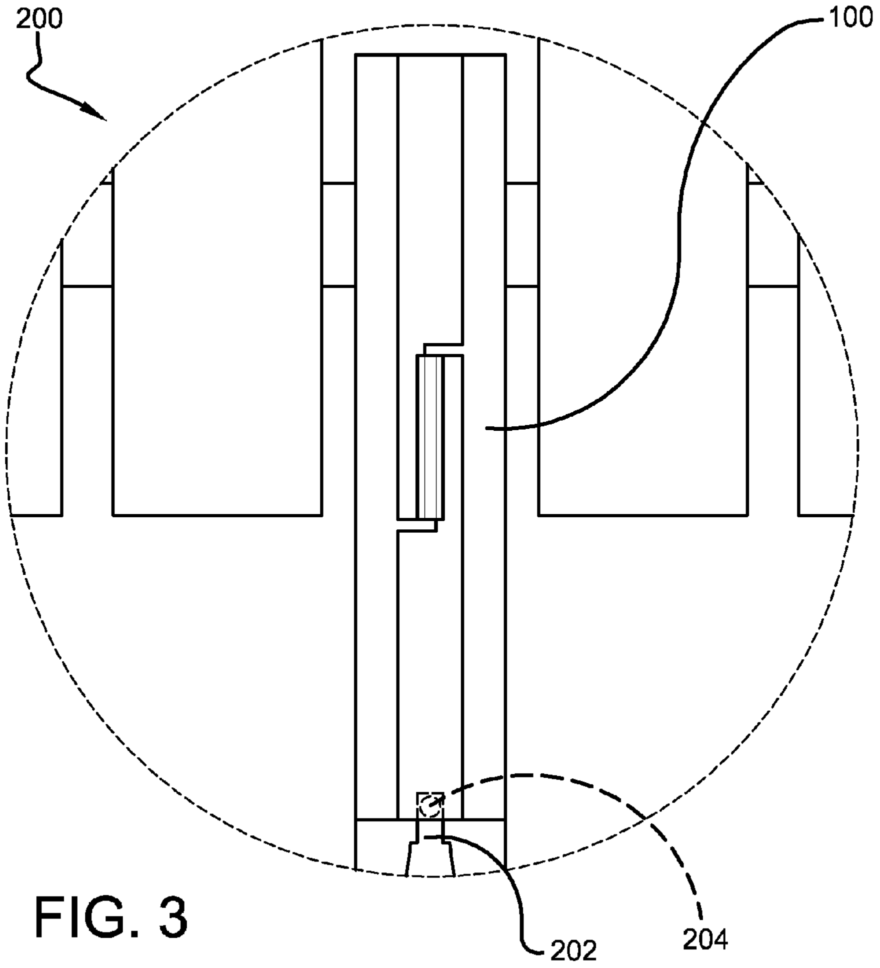
FIG. 3 illustrates a close-up view of the microwave termination in accordance with the disclosed architecture

FIG. 3 illustrates a close-up of the microwave termination 200 in accordance with the disclosed architecture. Electrodes of the thermistor 100 are arranged to be much wider than they are thick, presenting a width and cross-section that can be tailored to match a surface waveguide such as a stripline or the center conductor 202 of a coplanar waveguide. Specifically, FIG. 3 illustrates how the thermistor 100 can be matched to a microwave coplanar waveguide with center conductor 202 having the same width as the thermistor electrodes.

By extending the length of the electrodes a distance from the actual resistive thermistor material, the thin metal serves to further thermally isolate the thermistor from metal traces to which the thermistor 100 is attached. The thermistor 100 is typically secured by epoxy attach points 204 or solder between the distal ends of the electrodes of the thermistor 100 and the metal traces. Specifically, the thermistor 100 is secured to circuit traces of the microwave termination 200 via conductive expoxy attach points 204 at outer ends of the thermistor 100 and does not lay flat against the microwave termination 200 to ensure thermal performance.

Additionally, the co-axial microwave bolometer (thermistor) can use a dual coplanar waveguide, and can be used in any other application of bolometry, including waveguide power sensors for microwave power, but also possibly spectrometry, air flow sensors, or other applications in which bead-on-wire thermistor sensors are used.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A thermistor for use with a high-frequency coplanar waveguide, comprising:

a substrate; and at least two electrodes, secured to the substrate;

wherein the at least two electrodes by-pass each other to create a gap; and wherein thermistor material is deposited across the gap; and wherein the thermistor is used as a termination resistance in a microwave power sensor; and wherein the at least two electrodes have same width as a center conductor of a coplanar waveguide.

2. The thermistor of claim 1, wherein the surface waveguide is a stripline or a center conductor of a coplanar waveguide.

3. The thermistor of claim 1, wherein the thermistor is constructed using thick-film, thin-film or vapor deposition processes.

4. The thermistor of claim 3, wherein metallization upon the substrate is trimmed to dimension by chemical, vapor, plasma or laser etching with or without masking.

5. The thermistor of claim 1, wherein the thermistor is secured to circuit traces of the microwave power sensor via solder or conductive expoxy attach points at outer ends of the at least two electrodes.

6. The thermistor of claim 1, wherein the thermistor material deposited across the gap comprises a high temperature coefficient.

7. The thermistor of claim 6, wherein the thermistor material deposited across the gap is attached using screen printing or stenciling using a mask.

8. The thermistor of claim 1, wherein the substrate comprises crystalline Quartz cleaved in a Z-axis.

9. The thermistor of claim 8, wherein the at least two electrodes comprise Palladium deposited microns thick.

10. The thermistor of claim 9, wherein the at least two electrodes are 0.005" wide.

11. The thermistor of claim 10, wherein the thermistor has a room temperature resistance of 1,000 Ohms.

12. A thermistor used as a termination resistance in a microwave power sensor, comprising:

a substrate; and at least two electrodes, secured to the substrate;

wherein the at least two electrodes by-pass each other to create a gap; and wherein thermistor material is deposited across the gap creating a resistive path between the at least two electrodes; and wherein the at least two electrodes have same width as a center conductor of a microwave coplanar waveguide.

13. The thermistor of claim 12, wherein the thermistor is secured to circuit traces of the microwave power sensor via solder or conductive epoxy attach points at outer ends of the at least two electrodes.

14. The thermistor of claim 12, wherein the thermistor material deposited across the gap comprises a high temperature coefficient.

15. The thermistor of claim 14, wherein the thermistor material deposited across the gap is attached using screen printing or stenciling using a mask.

16. A thermistor for use in bolometry, comprising:

a substrate; and at least two electrodes, secured to the substrate; and wherein the at least two electrodes have same width as a center conductor of a surface waveguide; and wherein the thermistor is used as a termination resistance in a microwave power sensor.

17. The thermistor of claim 16, wherein the at least two electrodes by-pass each other to create a gap; and wherein thermistor material is deposited across the gap creating a resistive path between the at least two electrodes.

* * * * *